(12) United States Patent
Park

(10) Patent No.: US 7,098,825 B2
(45) Date of Patent: Aug. 29, 2006

(54) FIXED OFFSET DIGITAL-TO-ANALOG CONVERSION DEVICE AND METHOD

(75) Inventor: Kwang-Il Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/118,229

(22) Filed: Apr. 28, 2005

(65) Prior Publication Data

US 2006/0028366 A1   Feb. 9, 2006

(30) Foreign Application Priority Data

Aug. 6, 2004   (KR) .................. 10-2004-0061955

(51) Int. Cl.
*H03M 3/00* (2006.01)
*H03F 3/45* (2006.01)

(52) U.S. Cl. .................. 341/136; 341/135; 330/253

(58) Field of Classification Search ............ 341/118, 341/120, 136, 144, 153, 139, 150, 135; 324/207.12, 324/117 R; 327/103, 534; 330/2, 9, 253, 330/254, 255, 295; 398/202; 380/255
See application file for complete search history.

(56) References Cited

U.S. PATENT DOCUMENTS

| 4,636,744 A | * | 1/1987 | King et al. ............... 330/295 |
| 4,766,394 A | * | 8/1988 | Yukawa .................. 330/253 |
| 5,212,482 A | | 5/1993 | Okuyama ................ 341/139 |
| 5,327,099 A | * | 7/1994 | Fergus .................... 330/254 |
| 5,343,164 A | * | 8/1994 | Holmdahl ................ 330/253 |
| 5,789,974 A | * | 8/1998 | Ferguson et al. .......... 330/2 |
| 5,894,280 A | * | 4/1999 | Ginetti et al. ............ 341/118 |
| 5,936,468 A | * | 8/1999 | Wiese et al. ............. 330/255 |
| 6,081,218 A | | 6/2000 | Ju et al. .................. 341/150 |
| 6,469,579 B1 | * | 10/2002 | Bazes ..................... 330/253 |
| 6,522,175 B1 | * | 2/2003 | Ueno et al. .............. 327/103 |
| 6,590,980 B1 | * | 7/2003 | Moraveji ................. 380/255 |
| 6,646,580 B1 | * | 11/2003 | Clara et al. .............. 341/136 |
| 6,693,419 B1 | * | 2/2004 | Stauth et al. ........... 324/207.12 |
| 6,694,105 B1 | * | 2/2004 | Chang et al. ............. 398/202 |
| 6,696,894 B1 | * | 2/2004 | Huang .................... 330/253 |
| 6,707,333 B1 | * | 3/2004 | Matsumoto et al. ....... 327/534 |
| 6,816,099 B1 | * | 11/2004 | Brauns et al. ............ 341/153 |
| 6,894,477 B1 | * | 5/2005 | Cuplin et al. ........... 324/117 R |
| 6,917,322 B1 | * | 7/2005 | Ueno et al. .............. 341/144 |
| 6,952,130 B1 | * | 10/2005 | Kuyel et al. ............. 330/9 |

FOREIGN PATENT DOCUMENTS

| JP | 2002-164788 | 6/2002 |
| JP | 2003-338759 | 11/2003 |

OTHER PUBLICATIONS

English language abstract of Japanese Publication No. 2002-164788, no date.
English language abstract of Japanese Publication No. 2003-338759, no date.

* cited by examiner

*Primary Examiner*—Patrick Wamsley
(74) *Attorney, Agent, or Firm*—Marger Johnson & McCollom, P.C.

(57) ABSTRACT

I describe and claim an improved digital-to-analog conversion device and method. The device comprises a current supply circuit to generate a plurality of control currents responsive to a plurality of digital signals. An input voltage generating circuit is adapted to generate a plurality of input voltages responsive to the digital signals and the control currents. And a plurality of operational amplifiers is adapted to output a plurality of analog signals responsive to the input voltages.

24 Claims, 2 Drawing Sheets

FIXED OFFSET DIGITAL-TO-ANALOG CONVERSION DEVICE AND METHOD

BACKGROUND OF THE INVENTION

This application claims priority from Korean Patent Application No. 10-2004-0061955 filed on Aug. 6, 2004, which we incorporate by reference.

1. Field of the Invention

The field of the invention relates to a digital-to-analog conversion device and, more particularly, to a fixed offset digital-to-analog conversion device and method.

2. Description of the Related Art

A digital-to-analog conversion (DAC) device converts a digital input signal into an analog signal with a voltage level corresponding to the digital input signal. The converted analog signal may be used in various semiconductor devices performing digital to analog conversion. An example of a conventional DAC is disclosed in U.S. Pat. No. 5,212,482, titled Digital-To-Analog Converter Having An Externally Selectable Output Voltage Range, issued Mar. 18, 1993 to Tetsuo Okuyama.

FIG. 1 is a circuit diagram of a conventional DAC 10. Referring to FIG. 1, the DAC 10 includes an input voltage generating circuit 11 and operational amplifiers (OP AMPs) 12 and 13. The input voltage generating circuit 11 includes a plurality of NMOS transistors NM1 through NM9. The input voltage generating circuit 11 generates input voltages Vin and Vinb on output nodes D1 and D2 in response to digital code signals B0 through B2 and B0B through B2B, respectively. The OP AMPs 12 and 13 generate output voltages Vout and Voutb, respectively, in response to the input voltages Vin and Vinb, respectively, and a reference voltage Vref. The OP AMP 12 supplies a current I1 to the input voltage generating circuit 11 via a resistor R0. The OP AMP 13 supplies a current I2 to the input voltage generating circuit 11 via a resistor R1. Resistors R0 and R1 may form a feedback loop corresponding to OP AMPs 12 and 13, respectively. The OP AMPs 12 and 13 have input offset voltages Vos1 and Vos2, respectively, where the input offset voltages Vos1 and Vos2 may be determined according to Equation 1.

$$Vos1 = \frac{I1}{G1}$$
$$Vos2 = \frac{I2}{G2}$$

Equation 1

As shown in Equation 1, the input offset voltages Vos1 and Vos2 are proportional to the currents I1 and I2, respectively, and inversely proportional to the gain G1 of the OP AMP 12, and the gain G2 of the OP AMP 13. Since the input offset voltages Vos1 and Vos2 act as offsets (errors) of the output voltages Vout and Voutb, when the input offset voltages Vos1 and Vos2 increase, the offsets of the output voltages Vout and Voutb also increase.

The magnitude of the currents I1 and I2 supplied by OP AMPs 12 and 13, respectively, varies according to the digital code signals B0 through B2 and B0B through B2B input to the input voltage generating circuit 11. Specifically, when the number of NMOS transistors turned on in response to the digital code signals B0 through B2 increases, the magnitude of current I1 increases. Likewise, when the number of NMOS transistors turned on in response to the digital code signals B0B through B2B increases, the magnitude of current I2 increases. Since the magnitude of current OP AMPs 12 and 13 can supply to the input voltage generating circuit 11 is limited, the situation may arise when the OP AMPs 12 and 13 cannot sufficiently supply currents I1 and I2 to the input voltage generating circuit 11. Accordingly, the input voltage generating circuit 11 may generate the input voltages Vin and Vinb that do not correspond to the digital code signals B0 through B2 and B0B through B2B, causing the offsets of the output voltages Vout and Voutb to increase. Thus, in conventional DAC 10, the offsets of the output voltages Vout and Voutb change with changes to the digital code signals B0 through B2 and B0B through B2B.

SUMMARY OF THE INVENTION

The present invention provides a digital-to-analog conversion device to generate an analog signal with a fixed offset regardless of changes in a digital input signal. The device includes a current supply circuit to generate a plurality of control currents responsive to a plurality of digital signals, an input voltage generating circuit to generate a plurality of input voltages responsive to the digital signals and the control currents, and a plurality of operational amplifiers to output a plurality of analog signals responsive to the input voltages.

BRIEF DESCRIPTION OF THE DRAWINGS

The features and advantages of the present invention will become more apparent with a detailed description of the exemplary embodiments referencing the attached drawings.

DETAILED DESCRIPTION OF THE INVENTION

Figure 1:
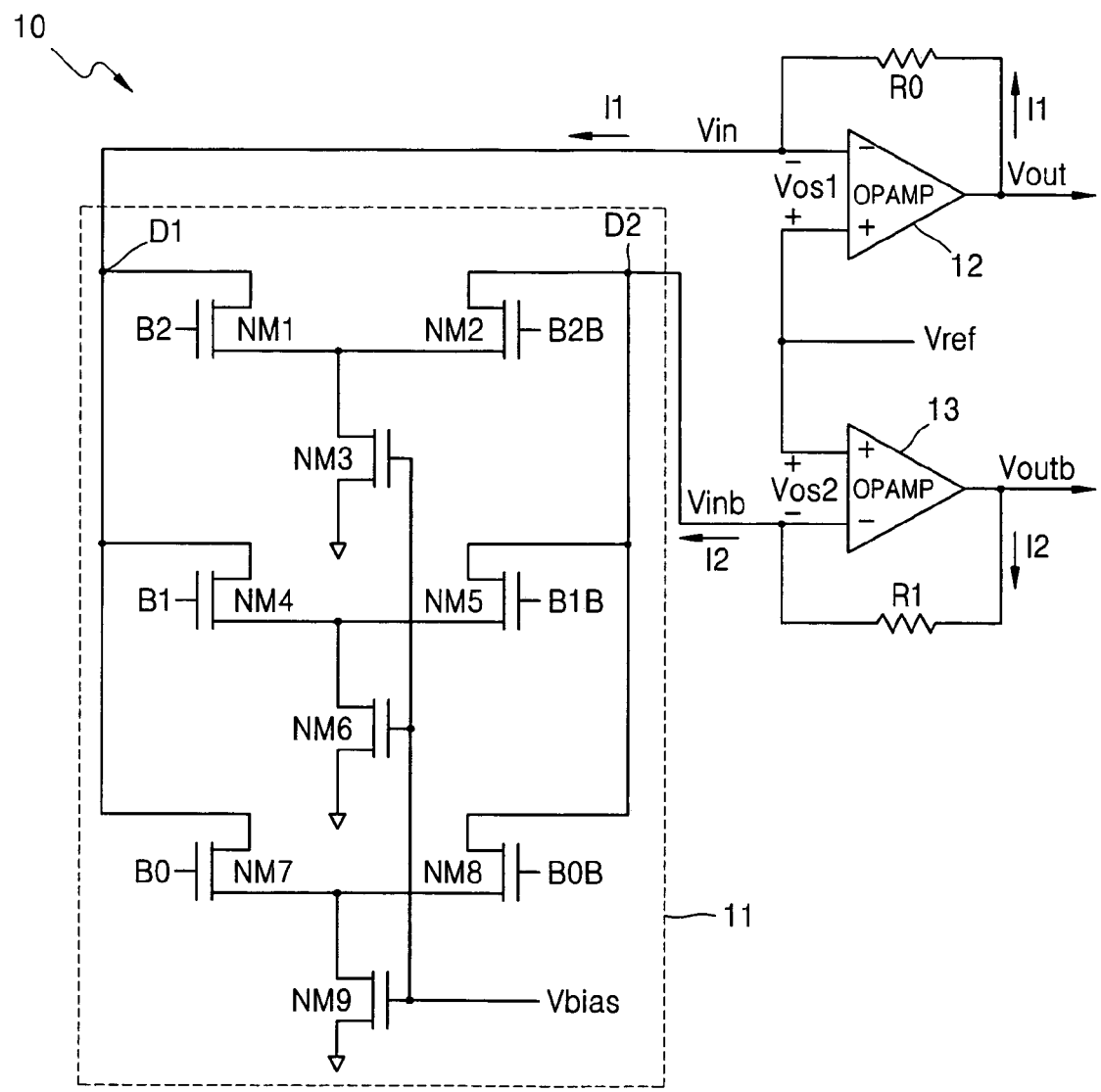
FIG. 1 is a circuit diagram of a conventional DAC.
Figure 2:
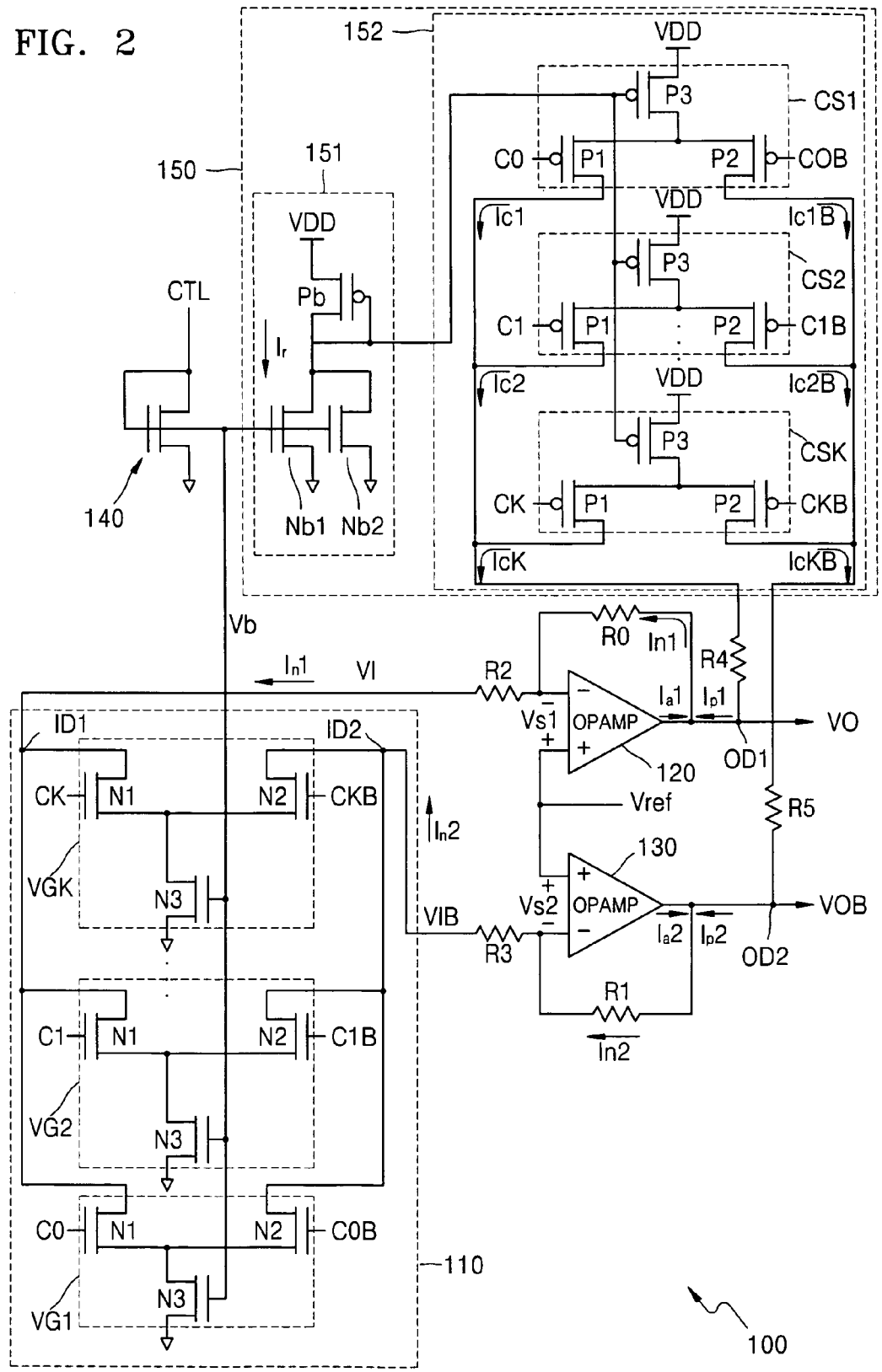
FIG. 2 is a circuit diagram of a DAC according to an embodiment of the present invention.

FIG. 2 is a circuit diagram of a DAC 100 according to an embodiment of the present invention. Referring to FIG. 2, the DAC 100 includes an input voltage generating circuit 110, OP AMPs 120 and 130, a bias circuit 140, and a current supply circuit 150. The input voltage generating circuit 110 includes a plurality of voltage generating circuits VG1–VGK. Each of the plurality of voltage generating circuits VG1–VGK may be a differential amplifier including NMOS transistors N1, N2, and N3 where NMOS transistor N3 acts as a current source for controlling operation of the NMOS transistors N1 and N2. Output ports of the plurality of voltage generating circuits VG1–VGK are coupled to input nodes ID1 and ID2, where the output ports may be coupled in parallel. In an embodiment, the drains of the NMOS transistors N1 and N2 of each of the plurality of voltage generating circuits VG1–VGK are coupled to the input nodes ID1 and ID2, respectively. The plurality of voltage generating circuits VG1–VGK generate input voltages VI and VIB on the input nodes ID1 and ID2 by drawing input currents $I_n1$ and $I_n2$ to a ground in response to digital code signals C0–CK and C0B–CKB, which may be complementary to each other. The input currents $I_n1$ and $I_n2$ may be complementary to each other. Digital code signals C0–CK and digital code signals C0B–CKB may be complementary to each other.

The OP AMP 120 includes a resistor R0 coupled between an output terminal of the OP AMP 120 and an inverse terminal of the OP AMP 120. Resistor R0 may form a negative feedback loop corresponding to OP AMP 120. The inverse terminal of the OP AMP 120 is coupled to the input node ID1 through a resistor R2. Likewise, the OP AMP 130 includes a resistor R1 coupled between an output terminal of the OP AMP 130 and an inverse terminal of the OP AMP 130. Resistor R1 may form a negative feedback loop corresponding to OP AMP 130. The inverse terminal of the OP AMP 130 is coupled to the input node ID2 through a resistor R3. In an embodiment, the resistances of the resistors R2 and R3 are smaller than the resistances of the resistors R0 and R1.

A reference voltage Vref is provided to the non-inverse terminals of the OP AMPs 120 and 130. The OP AMPs 120 and 130 generates output voltages VO and VOB, respectively, in response to the reference voltage Vref and the input voltages VI and VIB, respectively. OP AMPs 120 and 130 generate additional currents $I_a1$ and $I_a2$ provided to the resistors R0 and R1, respectively.

The bias circuit 140 generates a bias voltage Vb in response to a control signal CTL. In an embodiment, the bias circuit 140 may be a diode-connected NMOS transistor.

The current supply circuit 150 includes a reference current source circuit 151 and a current source circuit 152. The reference current source circuit 151 includes a PMOS transistor Pb and NMOS transistors Nb1 and Nb2. The reference current source circuit 151 is enabled or disabled in response to the bias voltage Vb. The reference current source circuit 151 generates a predetermined reference current $I_r$ when it is enabled. When the current capacities of the NMOS transistors Nb1 and Nb2 in the reference current source circuit 151 are changed, a magnitude of the reference current $I_r$ is also changed.

The current source circuit 152 includes a plurality of current source circuits CS1–CSK, each forming a current mirror with the reference current source circuit 151. The plurality of current source circuits CS1–CSK are coupled to output nodes OD1 and OD2. The current source circuits CS1–CSK may be coupled to output nodes OD1 and OD2 in parallel. Each of the plurality of current source circuits CS1 through CSK may be a differential amplifier including PMOS transistors P1, P2, and P3, where PMOS transistor P3 supplies an internal voltage VDD to the PMOS transistors P1 and P2. In an embodiment, the source of the PMOS transistor P3 is coupled to the internal voltage VDD, the gate of the PMOS transistor P3 is coupled to a gate of the PMOS transistor Pb of the reference current source circuit 151, and the drain of the PMOS transistor P3 is coupled to the sources of the PMOS transistors P1 and P2. The digital code signals C0–CK and C0B–CKB are coupled to gates of the PMOS transistors P1 and P2. Drains of the PMOS transistors P1 and P2 are coupled to the output nodes OD1 and OD2 through resistors R4 and R5, respectively. In an embodiment, the resistances of the resistors R4 and R5 are smaller than the resistances of the resistors R0 and R1. The resistors R0 through R5 may prevent glitches generated on the output voltages VO and VOB when the digital code signals C0–CK and C0B–CKB are changed.

The plurality of current source circuits CS1–CSK generates currents $I_c1$–$I_cK$ and $I_c1B$–$I_cKB$ in response to the digital code signals C0–CK and C0B–CKB, respectively. The currents $I_c1$–$I_cK$ and $I_c1B$–$I_cKB$ may be complementary to each other. Accordingly, control currents $I_p1$ and $I_p2$, obtained by respectively summing the currents $I_c1$–$I_cK$ and $I_c1B$–$I_cKB$, are provided to the resistors R0 and R1, respectively, where the input currents $I_n1$ and $I_n2$ are obtained by adding the additional currents $I_a1$ and $I_a2$ to the control currents $I_p1$ and $I_p2$. In an embodiment, the magnitudes of the additional currents $I_a1$ and $I_a2$ are smaller than the magnitudes of the input currents $I_n1$ and $I_n2$.

An operation of the DAC 100 will now be described in detail. The bias circuit 140 generates the bias voltage Vb in response to the control signal CTL. The input voltage generating circuit 110 and the current supply circuit 150 are enabled in response to the bias voltage Vb. The digital code signals C0–CK and C0B–CKB are provided to the input voltage generating circuit 110 and the current supply circuit 150. For example, assume that the input voltage generating circuit 110 includes three voltage generating circuits VG1–VG3 and the current source circuit 152 includes three current source circuits CS1–CS3, where the value of digital code signals C0–C2 is '101' and the value of digital code signals C0B–C2B is '010'.

In response to the digital code signals C0–C2, NMOS transistors N1 of the voltage generating circuits VG1 and VG3 are turned on, and a NMOS transistor N1 of the voltage generating circuit VG2 is turned off. NMOS transistor N2 of the voltage generating circuit VG2 is turned on and NMOS transistors N2 of the voltage generating circuits VG1 and VG3 are turned off in response to the digital code signals C0B through C2B. In response to the digital code signals C0 through C2, a PMOS transistor P1 of the current source circuit CS2 is turned on, and PMOS transistors P1 of the current source circuits CS1 and CS3 are turned off. PMOS transistors P2 of the current source circuits CS1 and CS3 are turned on and a PMOS transistor P2 of the current source circuit CS2 is turned off in response to the digital code signals C0B through C2B. The PMOS transistor P1 of the current source circuit CS2 provides a current Ic2 to the output node OD1 through the resistor R4, and the PMOS transistors P2 of the current source circuits CS1 and CS3 provide currents $I_c1B$ and $I_c3B$ to the output node OD2 through the resistor R5. The magnitude of the control current $I_p1$ is equal to the magnitude of the current $I_c2$, and the magnitude of the control current $I_p2$ is equal to a sum of the magnitudes of the currents $I_c1B$ and $1_c3B$. The OP AMPs 120 and 130 may generate the additional currents $I_a1$ and $I_a2$. Accordingly, the input currents $I_n1$ and $I_n2$ including the control currents $I_p1$ and $I_p2$ and the additional currents $I_a1$ and $I_a2$ are provided to the input voltage generating circuit 110 through the resistors R0 and R2, and R1 and R3, respectively.

Since the input currents $I_n1$ and $I_n2$ are formed in part by generating the control currents $I_p1$ and $I_p2$ in the current supply circuit 150, the magnitude of current supplied by the OP AMPs 120 and 130 may be reduced. Accordingly, input offset voltages Vs1 and Vs2 decrease, and thus offsets of the output voltages VO and VOB decrease. Since the control currents $I_p1$ and $I_p2$ comprise the majority of the input currents $I_n1$ and $I_n2$, the output voltages VO and VOB include fixed offsets irrelevant to a change in value of the digital code signals C0–CK and C0B–CKB. The input offset voltages Vs1 and Vs2 are shown according to Equation 2

$$Vs1 = \frac{I_a1}{G1}$$

$$Vs2 = \frac{I_a2}{G2}$$

Equation 2

In Equation 2, G1 indicates a gain of the OP AMP 120, and G2 indicates a gain of the OP AMP 130. Since the input offset voltages Vs1 and Vs2 are determined by the additional currents $I_a1$ and $I_a2$ as opposed to input currents $I_n1$ and $I_n2$, the input offset voltages Vs1 and Vs2 are smaller.

As described above, a DAC according to an embodiment of the present invention can output an analog signal having a fixed offset irrelevant to a change of a digital input signal.

While the present invention has been described with reference to exemplary embodiments, it will be understood by those of ordinary skill in the art that various changes in form and details may be made therein without departing from the spirit and scope of the present invention as defined by the following claims.

I claim:

1. A device comprising:
    a current supply circuit to generate a plurality of control currents responsive to a corresponding plurality of digital signals;
    an input voltage generating circuit to generate a plurality of input voltages responsive to the plurality of digital signals and control currents, the current supply circuit providing the control currents to the input voltage generating circuit, where the diaital signals identify both the magnitudes of the control currents and the voltage levels of the input voltages; and
    a plurality of operational amplifiers to output a plurality of analog signals responsive to the plurality of input voltages.

2. The device of claim 1 comprising a bias circuit to provide a bias voltage to the input voltage generating circuit and the current supply circuit.

3. The device of claim 2 where the current supply circuit is adapted to generate control currents responsive to the bias voltage and the digital signals.

4. The device of claim 2 where the input voltage generating circuit is adapted to generate input voltages responsive to the digital signals, the control currents, and the bias voltage.

5. The device of claim 1 where the input voltage generating circuit comprises a plurality of voltage generating circuits, each voltage generating circuit to adjust the magnitude of at least one of the input voltages responsive to the control currents and the digital signals.

6. The device of claim 5 where each voltage generating circuit is a differential amplifier including NMOS transistors.

7. The device of claim 1 where the current supply circuit includes:
    a reference current source circuit to generate a reference current; and
    a plurality of currentsource circuits, each current source circuit to adjust a magnitude of at least one of the control currents by a magnitude of the reference current responsive to the digital signals.

8. The device of claim 7 where each current source circuit is a differential amplifier including PMOS transistors.

9. The device of claim 7 where each current source circuit forms a current mirror with the reference current source circuit.

10. The device of claim 1
    where each operational amplifier is adapted to provide an additional current to the input voltage generating circuit; and
    where the input voltage generating circuit is adapted to generate the input voltages responsive to the digital signals, the control currents, and the additional currents.

11. The device of claim 10 where magnitudes of the additional currents are smaller than magnitudes of the control currents.

12. The device of claim 10
    where the additional currents are combined with the corresponding control currents; and
    where the input voltage generating circuit is adapted to generate the input voltages responsive to the digital signals, and the combination of the control currents and the additional currents.

13. The device of claim 1 where the plurality of operational amplifiers outputs the analog signals responsive to the input voltages and a reference voltage.

14. The device of claim 1 where a voltage offset between the analog signals remains substantially fixed responsive to changes in the plurality of digital signals.

15. A device comprising:
    a current supply circuit to generate a first control current responsive to a first digital signal, and a second control current responsive to a second digital signal;
    an input voltage generating circuit to generate a first input voltage responsive to the first digital signal and the first control current, and a second input voltage responsive to the second digital signal and the second control current;
    a first operational amplifier to output a first analog signal responsive to the first input voltage; and
    a second operational amplifier to output a second analog signal responsive to the second input voltage, where a voltage offset between the first and second analog signals remains substantially fixed responsive to chances in the first and second digital signals.

16. The device of claim 15 where the first and second digital signals are complementary.

17. The device of claim 15 where the input voltage generating circuit includes a plurality of voltage generating circuits, each voltage generating circuit to adjust the magnitude of the first input voltage responsive to the first control current and the first digital signal and to adjust the magnitude of the second input voltage responsive to the second control current and the second digital signal.

18. The device of claim 15 where the current supply circuit includes:
    a reference current source circuit to generate a reference current; and
    a plurality of current source circuits, each current source circuit to adjust a magnitude of the first control current by a magnitude of the reference current responsive to the first digital signal and to adjust a magnitude of the second control current by a magnitude of the reference current responsive to the second digital signal.

19. The device of claim 15
    where the first operational amplifier provides a first additional current to the input voltage generating circuit;
    where the second operational amplifier provides a second additional current to the input voltage generating circuit;
    where the input voltage generating circuit generates the first input voltage responsive to the first digital signal, the first control current, and the first additional current; and where the input voltage generating circuit generates the second input voltage responsive to the second digital signal, the second control current, and the second additional current.

20. A method comprising:
generating a plurality of control currents responsive to a plurality of digital signals;
generating a plurality of additional currents;
combining the control currents with a plurality of additional currents;
generating a plurality of input voltages responsive to the digital signals and the combination of the control currents and the additional currents; and
outputting a plurality of analog signals responsive to the input voltages.

21. The method of claim 20 comprising generating a bias voltage responsive to a control signal.

22. The method of claim 21 where generating the control currents occurs responsive to the bias voltage and the digital signals.

23. The method of claim 21 where generating the input voltages occurs responsive to the digital signals, the control currents, and the bias voltage.

24. The method of claim 20 where outputting the plurality of analog signals occurs responsive to the input voltages and a reference voltage.

* * * * *